(12) United States Patent
Hong et al.

(10) Patent No.: US 9,000,483 B2
(45) Date of Patent: Apr. 7, 2015

(54) SEMICONDUCTOR DEVICE WITH FIN STRUCTURE AND FABRICATION METHOD THEREOF

(71) Applicant: United Microelectronics Corp., Hsin-Chu (TW)

(72) Inventors: Shih-Fang Hong, Tainan (TW); Po-Chao Tsao, New Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 106 days.

(21) Appl. No.: 13/895,367

(22) Filed: May 16, 2013

(65) Prior Publication Data
US 2014/0339641 A1    Nov. 20, 2014

(51) Int. Cl.
H01L 31/0328 (2006.01)
H01L 29/94 (2006.01)
H01L 27/088 (2006.01)

(52) U.S. Cl.
CPC .................................. H01L 27/0886 (2013.01)

(58) Field of Classification Search
USPC ......................................... 257/192, 288, 368
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon et al. | |
| 7,646,046 B2 * | 1/2010 | Russ et al. | 257/288 |
| 7,700,456 B2 * | 4/2010 | Mikasa | 438/424 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2009/0124097 A1 | 5/2009 | Cheng | |
| 2009/0242964 A1 | 10/2009 | Akil | |
| 2009/0269916 A1 | 10/2009 | Kang | |
| 2010/0048027 A1 | 2/2010 | Cheng | |
| 2010/0072553 A1 | 3/2010 | Xu | |
| 2010/0144121 A1 | 6/2010 | Chang | |
| 2010/0167506 A1 | 7/2010 | Lin | |
| 2011/0111592 A1 * | 5/2011 | Cheng et al. | 438/689 |
| 2012/0126326 A1 | 5/2012 | Wang | |

* cited by examiner

*Primary Examiner* — Thanh V Pham

(74) *Attorney, Agent, or Firm* — Winston Hsu; Scott Margo

(57) ABSTRACT

A semiconductor device includes a substrate, a first fin structure, an electrical contact structure and a gate structure. The first fin structure includes a horizontal fin structure extending along a first direction and a vertical fin structure extending along a second direction. The substrate has a first region and a second region. A portion of the horizontal fin structure and the vertical fin structure are disposed in the first region, and the electrical contact structure directly covers the horizontal fin structure and the vertical fin structure within the first region. The gate structure partially overlaps the horizontal fin structure within the second region.

18 Claims, 6 Drawing Sheets

SEMICONDUCTOR DEVICE WITH FIN STRUCTURE AND FABRICATION METHOD THEREOF

BACKGROUND OF THE INVENTION

1. Field of the Invention

The present invention generally relates to the field of semiconductor devices, and more particularly, to a structure within a well pick-up region of a semiconductor device and a fabrication method thereof.

2. Description of the Prior Art

With the trend in the industry being towards scaling down the size of field effect transistors (FETs), three-dimensional or non-planar transistor technology, such as fin field effect transistor technology (FinFET) has been developed to replace conventional planar field effect transistors.

In current techniques, in order to meet the sub-lithographic features, semiconductor device manufacturers often utilize sidewall image transfer (SIT) technology to form required fin structures. In general, SIT may include the following steps. First, a plurality of dummy patterns is formed on a substrate. Then, spacers are respectively formed on each sidewall of the dummy patterns through a deposition and an etching process. Subsequently, patterns of the spacers may be transferred to the substrate by using the spacers as mask. In this way, a plurality of paralleled fin structures may be formed in the substrate and the physical dimensions of these fin structures may be used to define the shape and the width of the carrier channel in the transistors. However, the small surface area of these fin structures often limits the size of the contact area between itself and the corresponding electrical contact structure. Since the contact resistance is inversely proportional to the contact area, apparent voltage drop often occurs inevitably on the interface between the fin structures and the electrical contact structures within the well pick-up region, which is definitely bad for the electrical performance of the transistors.

In order to overcome the above-mentioned high contact resistance within the well pick-up region, there is a need to provide a modified semiconductor device and a fabrication method thereof.

SUMMARY OF THE INVENTION

To this end, the main objective of the invention is to provide a semiconductor device and a fabrication method thereof that can solve the problems of the conventional techniques.

According to one preferred embodiment of the present invention, a semiconductor device is provided. The semiconductor device includes a substrate, a first fin structure, an electrical connecting structure and a gate structure. The first fin structure includes at least a horizontal fin structure extending along a first direction and a vertical fin structure extending along a second direction. The substrate has a first region and a second region. A portion of the horizontal fin structure and the vertical fin structure are disposed in the first region, and the electrical connecting structure directly covers the horizontal fin structure and the vertical fin structure within the first region. The gate structure partially overlaps the horizontal fin structure within the second region.

According to another preferred embodiment of the present invention, a fabrication method of a semiconductor device is provided and includes the following steps. First, sacrificial patterns are formed on a substrate and a space is formed on the sidewalls of each sacrificial pattern. Then, the sacrificial patterns ate removed and patterns of the spacers are transferred into the substrate to form a fin structure. The fin structure includes a horizontal fin structure extending along a first direction and a vertical fin structure extending along a second direction. Subsequently, a gate structure, source/drain structures, and an electrical connecting structure are formed sequentially on the substrate. The gate structure overlaps portions of the horizontal fin structure. The source/drain structures are respectively on each side of the gate structure. The electrical connecting structure directly covers the horizontal fin structure and the vertical fin structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams showing a fabrication method of semiconductor structures according to a first preferred embodiment of the present invention, wherein:

FIG. 1 is a schematic top view showing a structure at the beginning of the fabrication process according to a first preferred embodiment of the present invention;

FIG. 2 is a schematic cross-sectional diagram taken along a line A-A' in FIG. 1;

FIG. 3 is a schematic cross-sectional diagram showing a structure after a pattern transfer process is carried out and a shallow trench isolation is formed;

FIG. 4 is a schematic top view showing a structure after a gate structure is formed;

FIG. 5 is a schematic cross-sectional diagram taken along a line A-A' in FIG. 4;

FIG. 6 is a schematic top view showing a structure after an electrical connecting structure is formed; and FIG. 7 is a schematic cross-sectional diagram taken along a line B-B' in FIG. 6.

DETAILED DESCRIPTION

Figure 1:
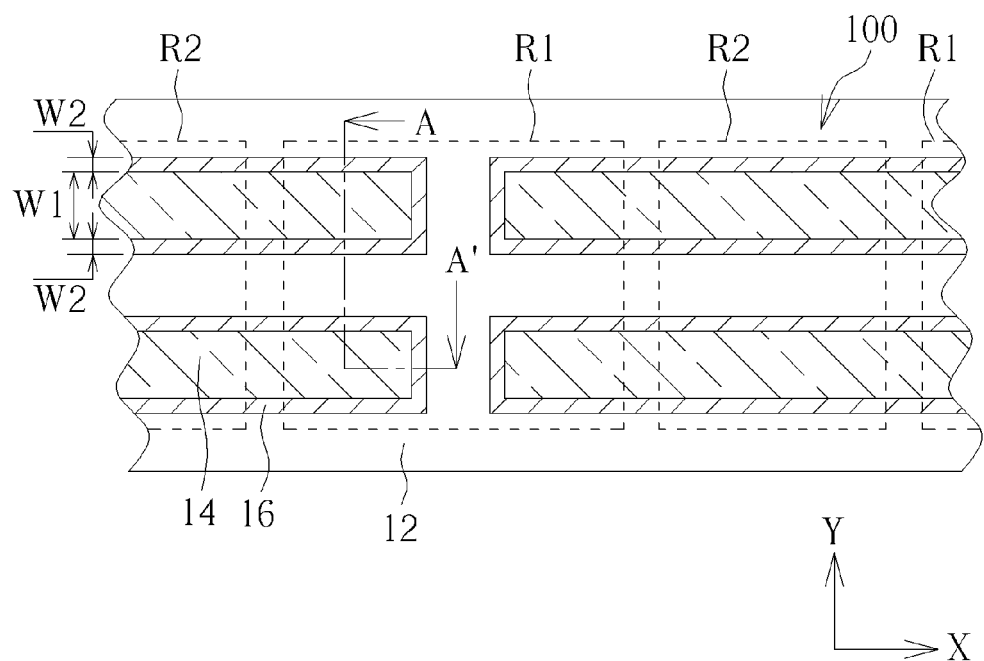

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 2:
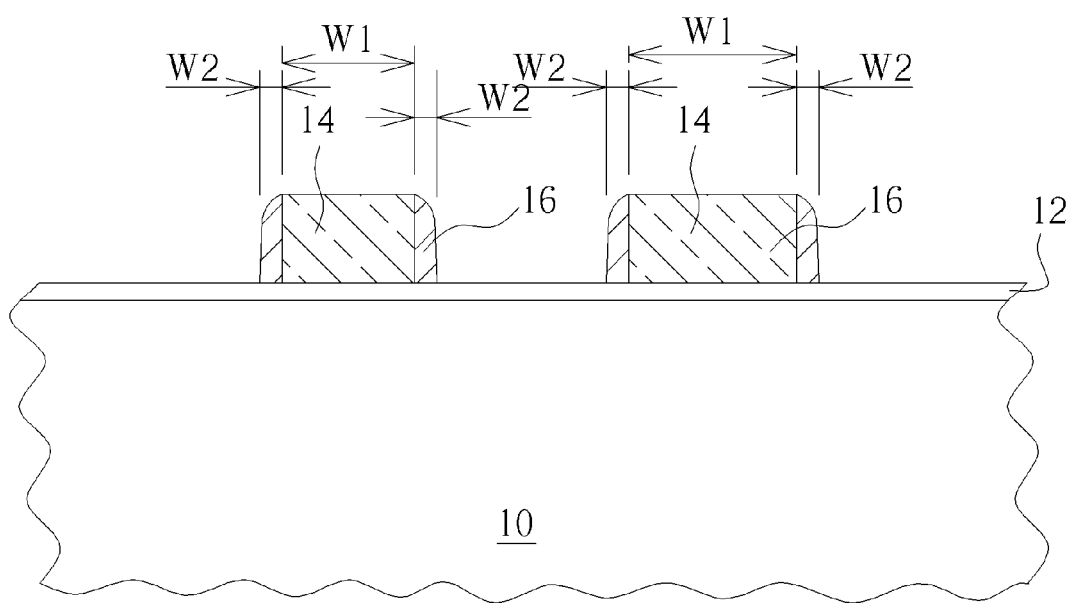

Refer to FIG. 1 and FIG. 2, FIG. 1 is a schematic top view showing a structure at the beginning of the fabrication process according to a first preferred embodiment of the present invention. FIG. 2 is a schematic cross-sectional diagram taken along a line A-A' in FIG. 1. In this stage, a substrate 10 having a plurality of sacrificial patterns 14 thereon is provided. The sidewalls of each of the sacrificial patterns 14 are covered by a spacer 16 with a loop-shaped appearance. The substrate 10 has a first region and a second region defined thereon, which may be respectively corresponding to a well pick-up region R1 and an active region R2 of the semiconductor device, but not limited thereto. Each sacrificial pattern 14 may cross both of the well pick-up region R1 and the active region R2. These sacrificial patterns 14 are arranged to have a first layout pattern 100, such as a matrix layout pattern respectively arranged along a first direction X and a second direction Y. The long axis of each of the sacrificial patterns 14 is parallel to the first direction X, but not limited thereto. Preferably, each sacrificial pattern 14 and each spacer 16 respectively have a first width W1 and a second width W2, and the first width W1 is wider than the second width W2.

The above-mentioned substrate 10 is preferably a semiconductor substrate, such as a silicon substrate, a silicon germanium or the like, and the substrate is preferably not chosen from a silicon-on-insulator (SOI) substrate. The dielectric layer 12 may be a nitride layer or an oxide layer, such as a silicon nitride layer, a silicon oxide layer or other layer made of suitable dielectric materials, which may be formed through a thermal oxidation process, a high density plasma CVD (HPCVD) process or a sub-atmosphere CVD (SACVD) process, but not limited thereto. Optionally, the dielectric layer may not be formed on the substrate according to other preferred embodiments. The sacrificial patterns 14 may be made of semiconductor materials, such as polysilicon material and may be formed through regular deposition, photolithographic, and etching processes. Because of the limited capability of the processing machine, a first width W1 of each of the sacrificial patterns 14 is substantially larger than or equal to the minimum exposure limit of the corresponding photolithography process. The spacers 16 may be made of dielectric materials, such as silicon nitride and may be formed through the following steps. First, a dielectric material layer (not shown) is formed to conformally encapsulate each sacrificial pattern 14 and to cover the dielectric layer 12. Then, the dielectric material layer can be blanketly etched (etched without mask) into a plurality of spacers 16 which is respectively on and around the sidewalls of each of the sacrificial patterns 14. The appearance of these spacers 16 is shown in FIG. 1. Preferably, etching rates on the dielectric layer 12, the sacrificial patterns 14, and the spacers 16 may be controlled at required values by adjusting the compositions of which.

Figure 3:
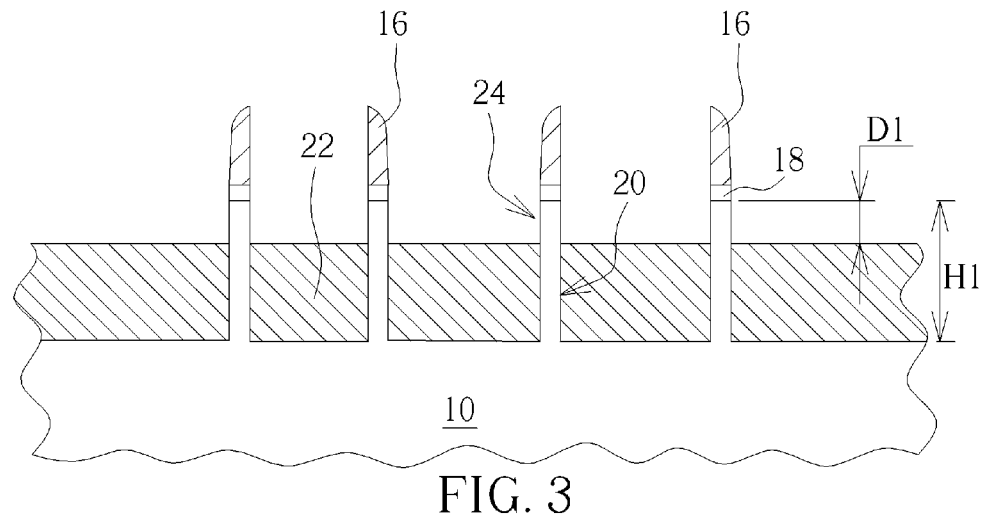

Please refer to FIG. 3. FIG. 3 is a schematic cross-sectional diagram showing a structure after an image transfer process is carried out and a shallow trench isolation is formed. The structure shown in FIG. 3 corresponds to a line A-A' in FIG. 1. Referring to FIG. 2 and FIG. 3, the sacrificial patterns 14 within the well pick-up region R1 and the active region R2 are removed completely so as to only leave spacers 16 on the dielectric layer 12. An image transfer process, such as a sidewall image transfer (SIT), is carried out subsequently. Through this process, a plurality of loop-shaped patterns defined by the spacers 16 may be transferred into the surface of the substrate 10 to therefore form a plurality of loop-shaped protruding structures 20. Each protruding structure 20 has a first height H1, and the patterned dielectric layer 18 and the spacer 16 are stacked thereon from bottom to top.

To put it more concretely, the image transfer process may include a series of etching processes, for example: first, a regular etching process (dry etching or wet etching) is carried out to remove the sacrificial patterns 14 and only leave the spacers 16 on the dielectric layer 12. By adjusting etch recipes of these etching processes, the etching rate of the sacrificial patterns 14 may be higher than that of the spacers 16 so that only little amount of the spacers 16 is etched away during these etching processes. Afterward, by using the spacers 16 as etching masks, one or more anisotropic etching process is carried out to sequentially and downwardly etch the dielectric layer 12 and/or portions of the substrate 10. Through these processes, the patterns defined by the spacers 16 may be transferred into the dielectric layer 12 and/or the substrate 10. It is worth noting that, the technical term "image transfer process" throughout the specification includes the concept of the technical term "sidewall image transfer", that is to say, the technical term "image transfer process" should be regarded as a generic concept of the technical term "sidewall image transfer".

Still refer to FIG. 3 accompanied with FIG. 2. After the image transfer process is completed, a series of fabrication processes may be carried out for dielectric layer in sequence, such a deposition process, a planarization process, and an etching back process, to form a shallow trench isolation 22 having a first depth D1 around the bottom of each of the protruding structures 20. Portions of each of the protruding structures 20, also called fin structures 24, may protrude from the surface of the shallow trench isolation 22 and have a height around 300 to 400 angstroms. It is worth noting that, the width of each of the spacers 16 may be trimmed away slightly during the above image transfer process. Therefore, the width of each of the fin structures 24 may be thinner than the original second width W2 of each corresponding spacer 16.

Figure 4:
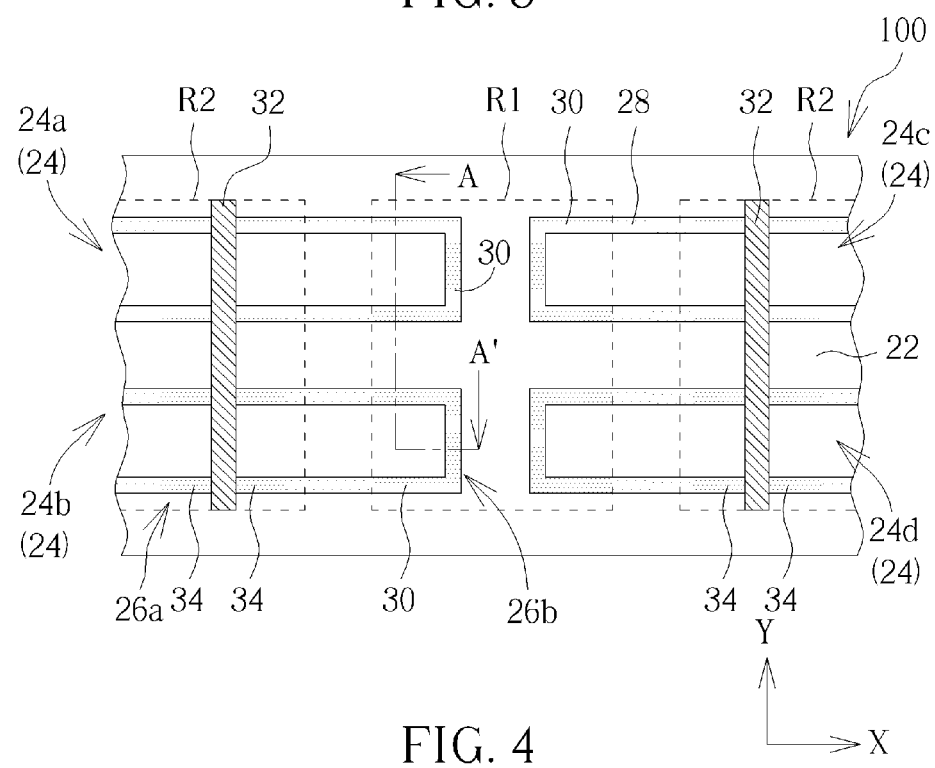
Figure 5:
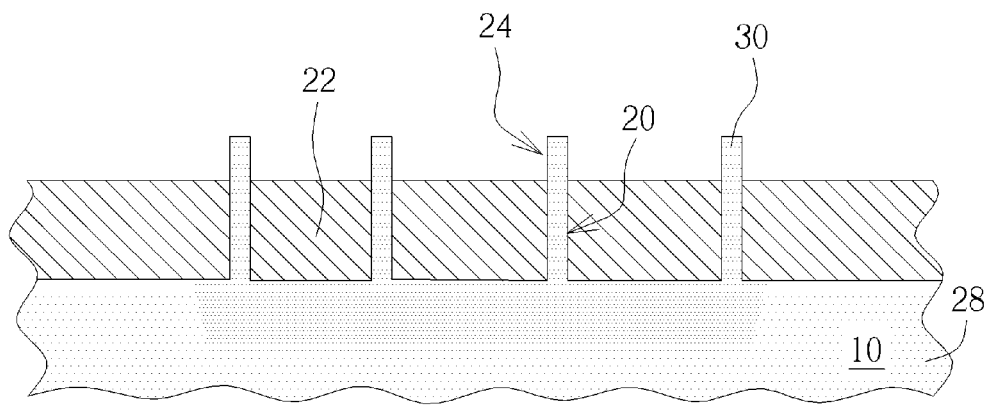

Please refer to FIG. 4 and FIG. 5. FIG. 4 is a schematic top view showing a structure after the formation of a gate structure. FIG. 5 is a schematic cross-sectional diagram taken along a line A-A' in FIG. 4. In FIG. 4 and FIG. 5 accompanied with FIG. 3, each spacer 16 and each patterned dielectric layer 18 stacked on the fin structures 24 are removed through a suitable etching process to expose fin structures 24, such as a first fin structure 24a, a second fin structure 24b, a third fin structure 24c and a fourth fin structure 24d, but not limited thereto. Preferably, each of the fin structures 24a, 24b, 24c and 24d is across the well pick-up region R1 and the active region R2 and a U-shaped end of each of the fin structures 24a, 24b, 24c and 24d is disposed within the well pick-up region R1. In other words, the end of each of the fin structures 24a, 24b, 24c and 24d has two horizontal fin structures 26a and a vertical fin structure 26b.

Afterward, other fabrication processes may be carried out. For example, a series of ion implantation processes are performed in sequence so that a well doped region 28 and a well pick-up doped region 30 having a first conductivity type, such as P type, are formed. The well doped region 28 is formed in both the well pick-up region R1 and the active region R2, while the well pick-up doped region 30 is merely formed in the well pick-up region R1. What is more, the well pick-up doped region 30 may be regarded as a heavily doped region disposed inside the well doped region 28. In other words, the doping concentration of the well pick-up doped region 30 is higher than that of the well doped region 28. In a next step, at least a gate structure 32 is formed in each of the active regions R2 so as to enable each gate structure 32 to concurrently directly contact with a set of mutually parallel fin structures 24, but not limited thereto. Accordingly to other embodiments, a set of mutually parallel gate structures may be disposed within each active region. Preferably, gate structures 32 may be arranged as shown in FIG. 4 and respectively encapsulate each fin structure 24. In addition, the structure of the gate structure 32 at least includes a gate dielectric layer (not shown), a gate conductive layer (not shown), and a cap layer (not shown) from bottom to top. The sidewalls of each gate structure 32 are covered by a gate spacer (not shown). The composition of the gate dielectric layer, the gate conductive layer, and the cap layer may respectively correspond to silicon oxide, polycrystalline silicon/metal material, and silicon nitride, but not limited thereto.

Still referring to FIG. 4, a coating and a photolithographic process are carried out sequentially so as to form a patterned mask layer (not shown) on the substrate 10. The patterned mask layer may expose the structures, such as the shallow trench isolation 22, the fin structures 24 and the gate structure 32, within each of the active regions R2. Afterward, under the coverage of the patterned mask layer, the gate structure 32, and the gate spacer, an ion implantation process is carried out so that a source/drain doped region 34 is formed in each fin structure 24 at each side of each gate structure 32. Each source/drain doped region 34 is a heavily doped and may be regarded as a region inside the well doped region 28. Additionally, the conductivity type of the source/drain doped region 34 differs from that of the well doped region 28 and the well pick-up doped region 30. That is to say, each source/drain doped region 34 has a second conductivity type, such as N-type, according to the present embodiment. Finally, the patterned mask layer is removed.

Figure 6:
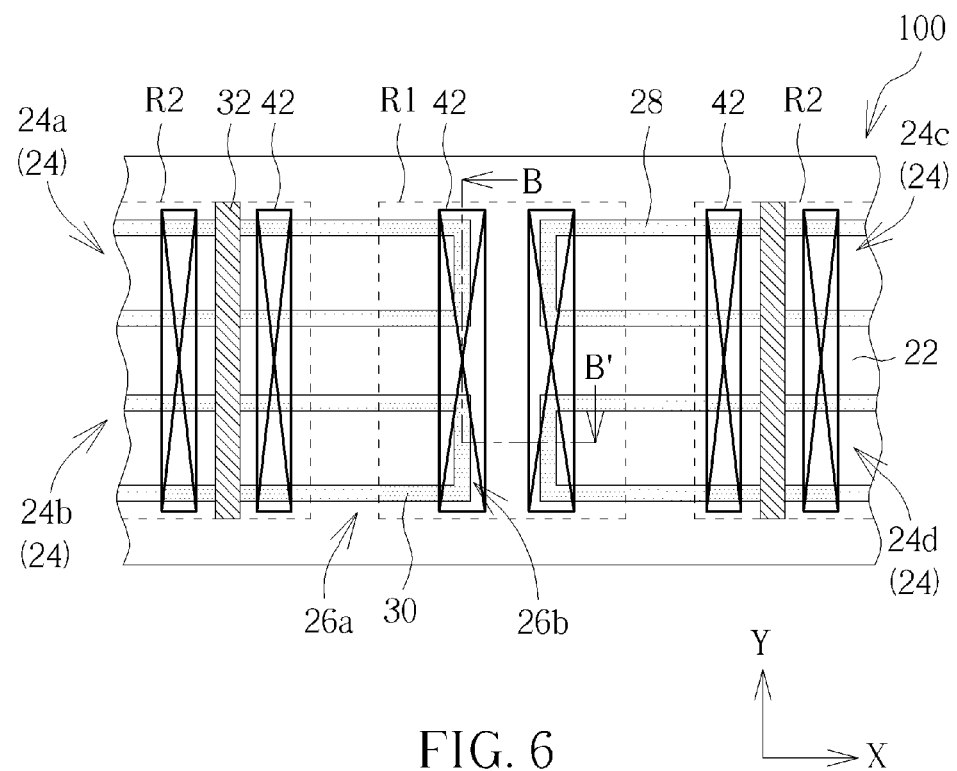
Figure 7:
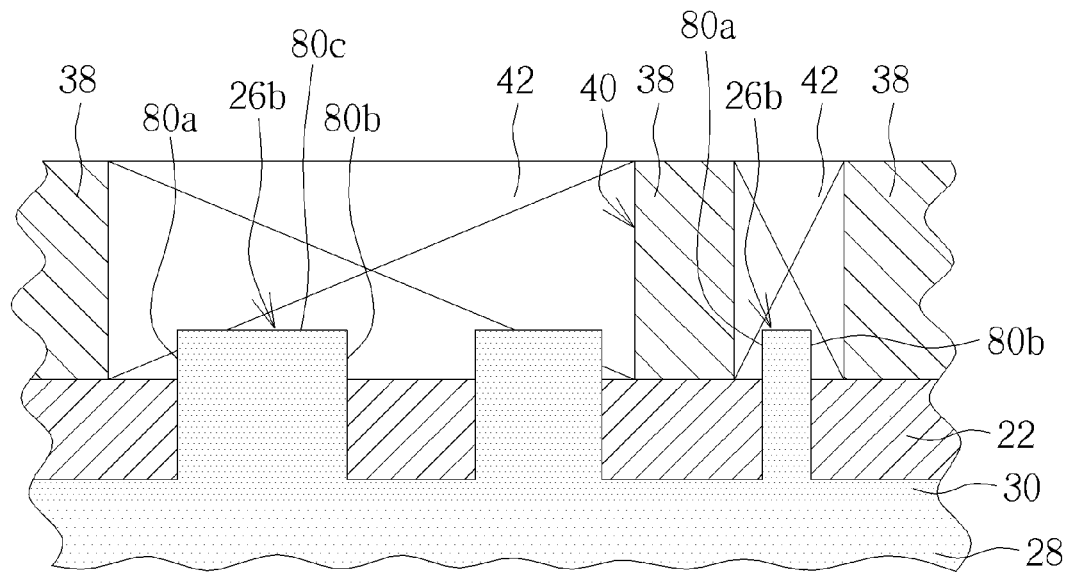

Please refer to FIG. 6 and FIG. 7. FIG. 6 is a schematic top view showing a structure after an electrical connecting structure is formed. FIG. 7 is a schematic cross-sectional diagram taken along a line B-B' in FIG. 6 Referring to FIG. 6 and FIG. 7, after the removal of the patterned mask layer, a blanket deposition process is carried out to form an interlayer dielectric 38 on the substrate 10. Subsequently, a planarization process is implemented on the interlayer dielectric 38 and the interlayer dielectric 38 may still completely cover each fin structure 24 and each gate structure 32. Then, a plurality of contact holes 40 is formed in the interlayer dielectric 38 through an etching process and portions of the corresponding fin structure 34 may be exposed from the bottom of the contact holes 40. In the subsequent fabrication process, the portions of each fin structures 24 exposed from the contact hole 40 may be used as contact regions to be electrically connected to an external circuit.

It should be noted that, since a gate first process is adopted in this embodiment, the conductive material in the gate structure 32 will not be replaced after the interlayer dielectric 38 is formed, but not limited thereto. The present invention may also adopt a gate last process, also called replacement metal gate (RMG), so as to replace the conductive material in the gate structure. For example, after the formation of the interlayer dielectric, a polishing process may be carried out continuously until the exposure of a top portion of the gate structure, such as the exposure of the cap layer. Then, at least a removing process and a metal deposition process are carried out so as to replace the original conductive material in the gate structure, such as polycrystalline silicon, with a metal material with relatively high conductivity, such as aluminum, tungsten, copper or the like. In this way, the gate last process is accomplished.

Still referring to FIG. 6 and FIG. 7, after a plurality of contact holes 40 is formed in the interlayer dielectric 38, an electrical contact structure 42 may then be formed inside each contact hole 40, such as a slot contact structure, to be in direct contact with and cover portions of each fin structure 24. One feature of the present invention is that the electrical contact structure 42 within the well pick-up region R1 may not only directly cover the horizontal fin structure 26a, but also directly cover the vertical fin structure 26b. To put it more concretely, each electrical contact structure 42 within the well pick-up region R1 may concurrently cover two opposite lateral surfaces 80a and 80b and top surface 80c of each horizontal fin structure 26a and each vertical fin structure 26b, which enables its contact area to be increased and its contact resistance to be reduced. In this structure, if a voltage is applied to the well pick-up region, only a small voltage drop will occur on the interface between the electrical contact structure and the horizontal and vertical fin structures. As a result, the voltage can be effectively applied to the well doped region through the well pick-up doped region. It should be noted that the electrical contact structure 42 may include a barrier layer and/or adhesive layer, such as titanium nitride or tantalum nitride, and an electrical conductive layer, such as aluminum, tungsten, copper or other conductive materials with relatively high conductivity, but not limited thereto.

In addition to the above-mentioned first preferred embodiment, the present invention also includes other modified embodiments of semiconductor structures. Since structures and fabrication process in these modified embodiments are substantially similar to those disclosed in the first preferred embodiment, the following paragraphs will focus on the main difference among these embodiments and similar features will usually be described with same reference numerals for ease of illustration and description thereof.

Figure 8:
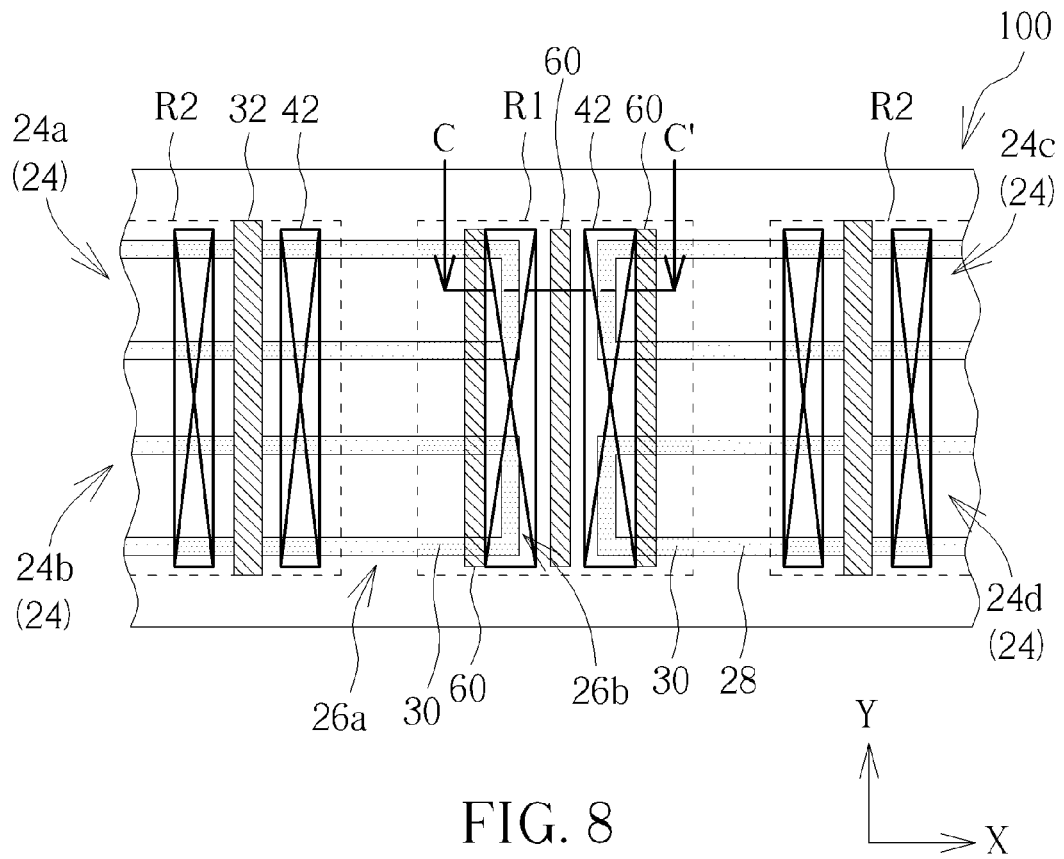
FIG. 8 is a schematic top view showing a structure according to a first modification of the first preferred embodiment of the present invention.
Figure 9:
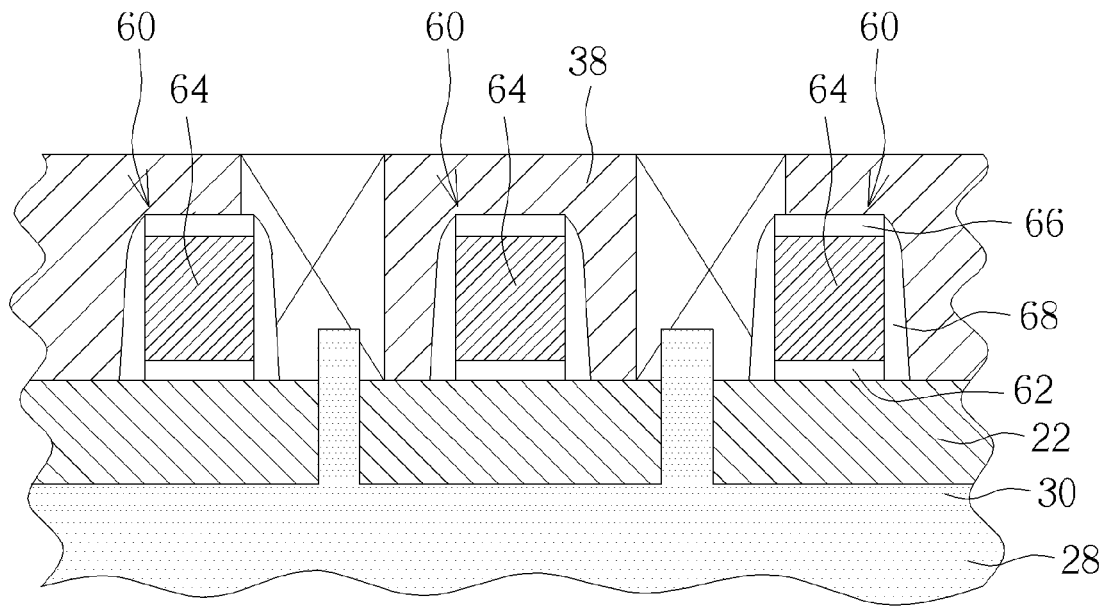
FIG. 9 is a schematic cross-sectional diagram taken along a line C-C' in FIG. 8.

Please refer to FIG. 8 and FIG. 9. FIG. 8 is a schematic top view showing a structure according to a first modification of the first preferred embodiment of the present invention. FIG. 9 is a schematic cross-sectional diagram taken along a line C-C' in FIG. 8. The structure shown in FIG. 8 according to the first modification corresponds to the structure shown in FIG. 6 according to the first preferred embodiment. The main difference between these two embodiments is that a semiconductor device according to the first modification further includes a plurality of shielding structures 60 used to prevent epitaxial layers from growing in specific regions of the fin structures 24. At least one of the shielding structures 60 is disposed between the two electrical contact structures 42 within the well pick-up region R1, while at least two of the shielding structures 60 are in direct contact with a set of fin structures 24 within the well pick-up region R1, especially in direct contact with a plurality of horizontal fin structures 26a, but not limited thereto. Therefore, each electrical contact structure 42 within the well pick-up region R1 may cover and directly contact the corresponding shielding structure 60, but not limited thereto. Accordingly to other embodiments, the shielding structures may also be disposed between the electrical connecting structures respectively within the well pick-up region and the active region so that they may be separated from the electrical connecting structures. Compared with conventional semiconductor devices, even though the shielding structures 60 are disposed on the substrate 10 according to the first modification, the existence of the vertical fin structures 26b within the well pick-up region R1 may enable the semiconductor device to have relatively low contact resistance and the reduced size of well pick-up region R1. Accordingly, the integrity of the semiconductor device is improved.

To put it more concretely, the structure and the fabrication timing of the shielding structures 60 according to this first modification may be the same as that of the gate structure 32 within the active region R2. For example, when the gate structure is formed through the gate first process, each shielding structure 60 may also encapsulate portions of each of the fin structures 24. The shielding structure 60 may at least include a dielectric layer 62, an electrical conductive layer 64, and a cap layer 66 from bottom to top. Additionally, the composition of the dielectric layer, the electrical conductive layer, and the cap layer may be respectively corresponding to that of the gate dielectric layer, the gate conductive layer, and the cap layer disclosed in the first preferred embodiment, but not limited thereto. A gate last process may also be adopted for fabricating the gate structure and/or the shielding structure according to the present invention.

Figure 10:
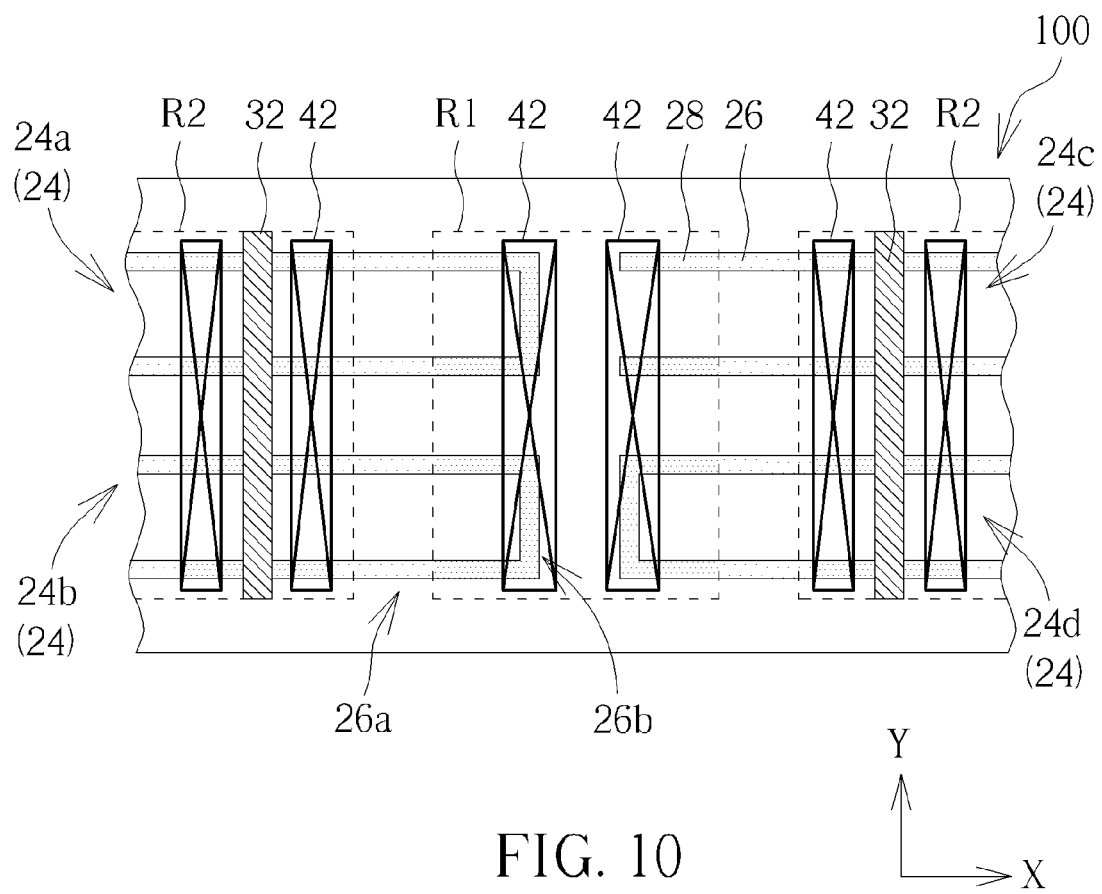
FIG. 10 is a schematic top view showing a structure according to a second modification of the first preferred embodiment of the present invention.

In addition to the first modification, the present invention further includes a second modification of the first preferred embodiment. Please refer to FIG. 10. FIG. 10 is a schematic top view showing a structure according to a second modification of the first preferred embodiment of the present invention. The structure and the fabrication timing according to this second modification may be similar to that according to the first preferred embodiment. The main difference between these two structures is that the third fin structure 24c on the right side of the active region R2 only has two parallel horizontal fin structures 26a and has no vertical fin structure 26b. In contrast, the first, second, and fourth fin structures 24a, 24b, and 24d still have the horizontal fin structures 26a and the vertical fin structure 26b. Accordingly, the electrical contact structure 42 disposed on the right side of the well pick-up region R1 may only directly cover the two parallel horizontal fin structures 26a of the third fin structure 24c. Apart from the third fin structure 24c without the vertical fin structure 26b, the structure and the fabrication processes according to this second modification are substantially similar to that shown in FIG. 1 to FIG. 9 according to the first preferred embodiment and the first modification. The detailed description of these is therefore omitted for the sake of clarity.

Figure 11:
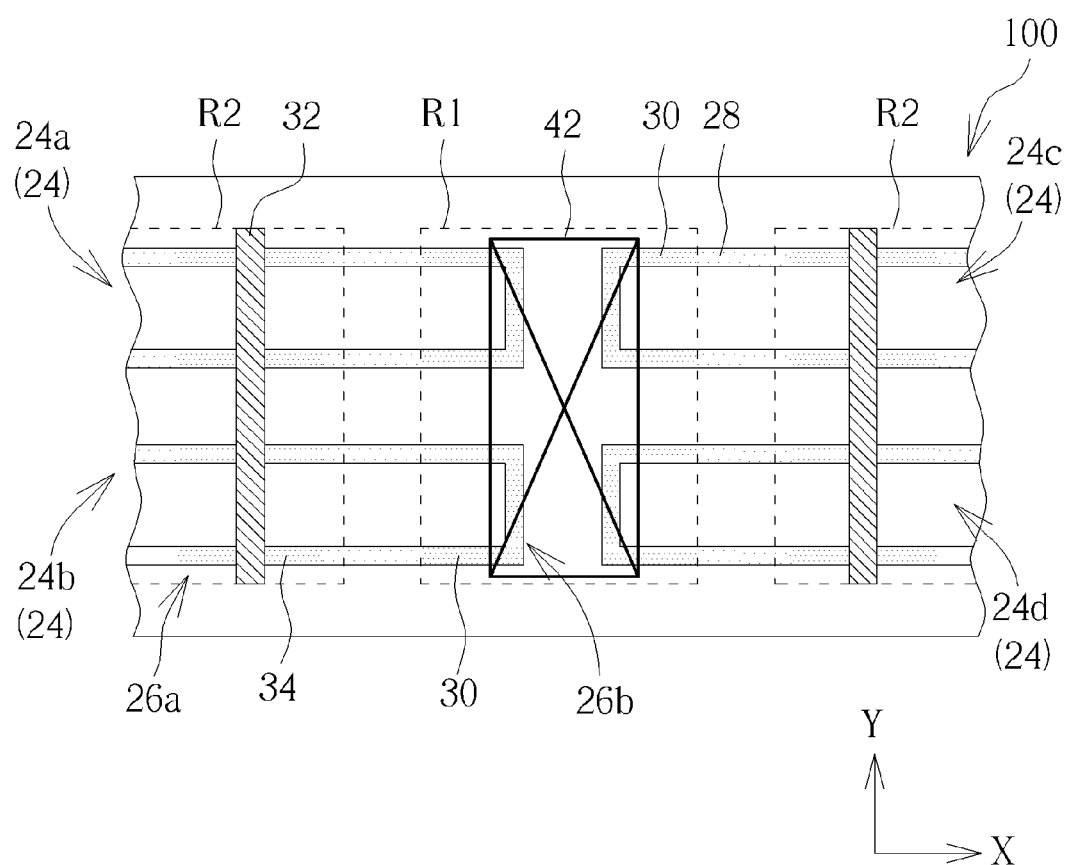
FIG. 11 is a schematic top view showing a structure according to a third modification of the first preferred embodiment of the present invention.

In addition to the first modification, the present invention further includes a third modification of the first preferred embodiment. Please refer to FIG. 11. FIG. 11 is a schematic top view showing a structure according to a third modification of the first preferred embodiment of the present invention. The structure and the fabrication processes according to this third modification are substantially similar to that according to the first preferred embodiment. The main difference between these two embodiments is that the electrical contact structure 42 within the well pick-up region R1 directly covers all vertical fin structures 26b of the first to fourth fin structures 24a, 24b, 24c and 24d. Apart from the electrical contact structure 42 directly covering all vertical fin structure 26b of the first to fourth fin structures 24a, 24b, 24c and 24d, the structure and the fabrication processes according to this third modification are substantially similar to that shown in FIG. 1 to FIG. 9 according to the first preferred embodiment and the first modification. The detailed description of which is therefore omitted for the sake of clarity.

It should be noted that each of the modifications should not be construed in a limiting sense and may be combined with one another properly if required. For example, under a situation that the well pick-up region includes the shielding structure therein, there may be only one electrical contact structure disposed within the well pick-up region to directly contact with all the vertical fin structures in the first to fourth fin structures, but not limited thereto.

For the sake of clarity, the horizontal and vertical fin structures 26a and 26b disclosed in each of the above-mentioned embodiments are used as contact regions within the well pick-up region R1. However, the horizontal and vertical fin structures 26a and 26b according to the present invention can be not only used within the well pick-up region R1, but also equivalently applied within other suitable regions. For example, the horizontal and vertical fin structures may be applied in source/drain regions of a transistor, or applied in resistor, diode device, photosensitive device, bipolar junction transistor (BJT), or the like.

To summarize, accordingly to embodiments of the present invention, the horizontal fin structures and the vertical fin structures are disposed within the well pick-up region of the semiconductor device. Therefore, the electrical contact structure within the well pick-up region may not only directly cover the horizontal fin structure, but also directly cover vertical fin structure, which enables the relatively high contact area and relatively low contact resistance become possible. In this structure, if a voltage is applied to the well pick-up region, only a small voltage drop will occur between the electrical contact structure and the horizontal and vertical fin structures. As a result, the voltage can be effectively applied to the well doped region through the well pick-up doped region and the performance of the semiconductor device is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
   a substrate, having a first region and a second region;
   a first fin structure, disposed on the substrate, the first fin structure comprising at least a horizontal fin structure extending along a first direction, and a vertical fin structure extending along a second direction, wherein portions of the horizontal fin structure and the vertical fin structure are disposed in the first region;
   an electrical contact structure, directly covering the horizontal fin structure and the vertical fin structure within the first region; and
   a gate structure, disposed on the substrate, wherein the gate structure partially overlaps the horizontal fin structure within the second region.

2. The semiconductor device according to claim 1, wherein the first direction is perpendicular to the second direction.

3. The semiconductor device according to claim 1, wherein the first fin structure is a loop structure.

4. The semiconductor device according to claim 1, wherein the first fin structure is a loop structure with an opening.

5. The semiconductor device according to claim 1, the first fin structure further comprising another horizontal fin structure extending along the first direction, wherein the electrical contact structure is in direct contact with the horizontal fin structures and the vertical fin structure within the first region.

6. The semiconductor device according to claim 1, wherein the horizontal fin structure and the vertical fin structure respectively comprise two opposite lateral surfaces, and the electrical contact structure is in direct contact with the lateral surfaces.

7. The semiconductor device according to claim 1, wherein the first region is a well pick-up region and the second region is an active region.

8. The semiconductor device according to claim 7, further comprising a well pick-up doped region having a first conductivity type and disposed within the well pick-up region.

9. The semiconductor device according to claim 7, further comprising a source/drain doped region having a second conductivity type and disposed within the active region.

10. The semiconductor device according to claim 9, wherein the source/drain doped region is disposed within the horizontal fin structure and at one side the gate structure.

11. The semiconductor device according to claim 1, further comprising a well pick-up doped region and a source/drain doped region respectively disposed within the first region and within the second region, wherein the well pick-up doped region has a first conductivity type, the source/drain doped region has a second conductivity type, and the first conductivity differs from the second conductivity type.

12. The semiconductor device according to claim 1, further comprising a shielding structure covering portions of the horizontal fin structure, wherein the electrical contact structure covers portions of the shielding structure.

13. The semiconductor device according to claim 1, further comprising:
   a second fin structure, disposed on the substrate, the second fin structure comprising at least a horizontal fin structure extending along the first direction and a vertical fin structure extending along the second direction, wherein portions of each of the horizontal fin structures and the vertical fin structures are disposed within the first region.

14. The semiconductor device according to claim 13, wherein the first direction is perpendicular to the second direction.

15. The semiconductor device according to claim 13, wherein the electrical contact structure is in direct contact with horizontal fin structures and the vertical fin structures.

16. The semiconductor device according to claim 13, wherein the horizontal fin structure and the vertical fin structure respectively comprise two opposite lateral surfaces, and the electrical contact structure is in direct contact with the lateral surfaces.

17. The semiconductor device according to claim 16, further comprising a well pick-up doped region and a source/drain doped region respectively disposed within the first region and within the second region, wherein the source/drain doped region is disposed in at least one of the horizontal fin structures and is disposed at one side of the gate structure.

18. The semiconductor device according to claim 17, wherein the well pick-up doped region has a first conductivity, the source/drain doped region has a second conductivity type, and the first conductivity differs from the second conductivity type.

* * * * *